Nov. 21, 1961 S. L. BROADHEAD, JR., ET AL 3,010,077

OSCILLATOR WITH AMPLITUDE STABILIZATION AND STARTING PHASE CORRECTION

Filed July 2, 1959

INVENTORS
SAMUEL L. BROADHEAD JR.
JOHN E. McINERNEY
BY Marvin Moody
ATTORNEY
Glenn H. Antrim
AGENT United States Patent Office 3,010,077
Patented Nov. 21, 1961

3,010,077

OSCILLATOR WITH AMPLITUDE STABILIZATION AND STARTING PHASE CORRECTION

Samuel L. Broadhead, Jr., and John F. McInerney, Cedar Rapids, Iowa, assignors to Collins Radio Company, Cedar Rapids, Iowa, a corporation of Iowa Filed July 2, 1959, Ser. No. 824,747
2 Claims. (Cl. 331—164)

This invention pertains to crystal oscillators and particularly to crystal oscillators having phase correction circuits that provide different output reactances as required for starting and for maximum signal output.

A usual type crystal oscillator includes an electron tube, a frequency-determining crystal in the grid circuit of the tube, and a tuned inductor-capacitor circuit connected to the plate. This type of crystal oscillator circuit is known to require a more inductive output circuit for generating a maximum signal than is required for starting. In effect, the crystal appears to have increased its capacitance as a result of its operation and, therefore, requires a greater plate inductance when it is operating to provide maximum output. Therefore, after a plate circuit has been adjusted to provide the required inductive reactance for maximum signal amplitude, it has to be re-adjusted to provide decreased inductive reactance before the oscillator will start again.

Accordingly, the oscillator of this invention includes an electron amplifying device, a crystal and a choke in series in the input circuit of the amplifying device, and a diode in series with a capacitor within a tuned output circuit of the amplifying device, the diode becoming conductive in response to operation of the oscillator for increasing the parallel capacitance of the tuned output circuit.

An object of this invention is to provide in a crystal oscillator, phase correcting means that automatically varies the inductive reactance of the output circuit between the values required for starting and for maximum signal output.

A feature of this invention is the stabilization of the amplitude of the generated signal.

Another feature is the utilization of a choke of proper value in the crystal circuit for preventing oscillation at undesired frequencies.

Figure 1:
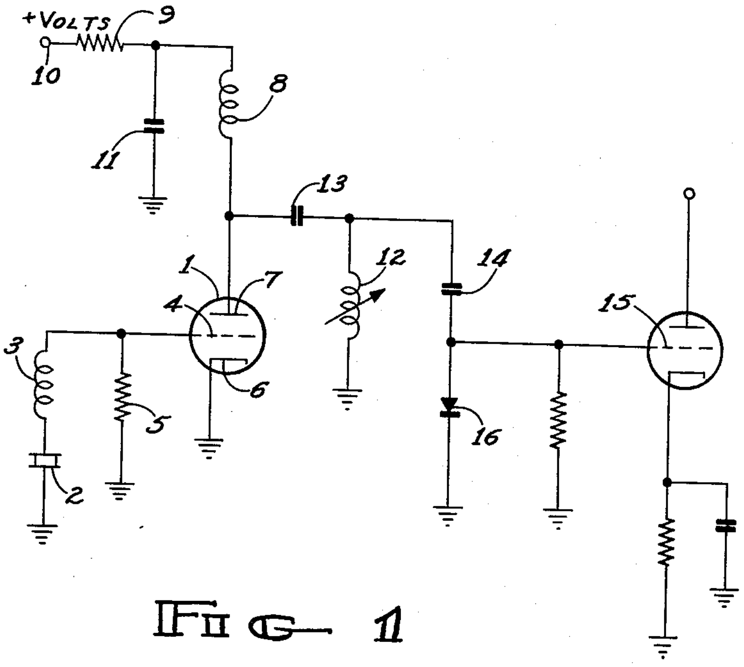
Figure 2:
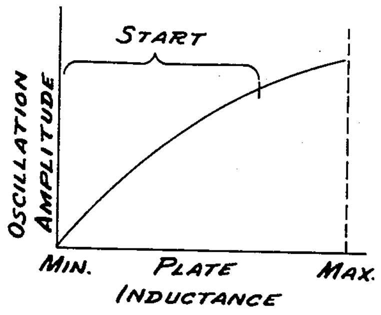
Figure 3:
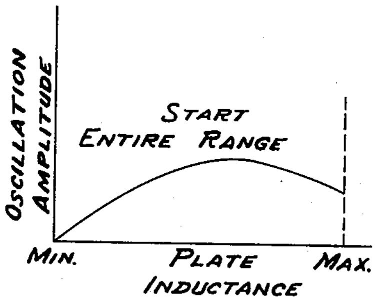

The following description and the appended claims can be more readily understood with reference to the accompanying drawings, in which:

FIGURE 1 is a schematic diagram of a crystal oscillator that has amplitude stabilization and starting phase correction according to this invention; and FIGURES 2 and 3 are graphs showing variation of the amplitude of the oscillator signal with increasing inductive reactance in the output circuit, FIGURE 2 applying to conventional crystal oscillator circuits, and FIGURE 3 applying to oscillator circuits that utilize the phase correction circuit of this invention.

The crystal oscillator of FIGURE 1 uses a conventional triode tube 1 as the amplifying device which is required for generating oscillations. The quartz oscillator plate or crystal 2 and the choke coil 3 are connected in series between ground and the control grid 4 of tube 1. In this particular circuit that operates in the ultra-high frequency range, it is found advantageous to have the choke coil 3 connected between the control grid 4 and the crystal 2 in order to eliminate oscillations at frequencies lower than the desired frequency. Resistor 5 that is connected between control grid 4 and ground is the usual grid bias resistor. The crystal 2 determines the frequency of the signal which is applied between control grid 4 and cathode 6 which is connected to ground. For applying direct-current voltage to plate 7 of tube 1, the plate is connected through choke coil 8 and filter resistor 9 to terminal 10 that is connected to a source of positive voltage. The choke coil has high impedance at the desired output frequency. Capacitor 11 that is connected between the ground and the junction of resistor 9 and choke 8 is a usual by-pass capacitor. A variable inductor 12 in the tuned plate circuit is connected between ground and blocking capacitor 13 that is connected to plate 7. The block capacitor 13 and the variable inductor are also connected to capacitor 14 that functions both as a coupling capacitor and as a tuning or phase shifting capacitor. The plate circuit of the oscillator stage is coupled through capacitor 14 to control grid 15 of a conventional buffer amplifier stage, and the capacitor 14 is connected through diode 16 to ground. When the diode 16 is conductive, capacitor 14 is connected in parallel with the inductor 12 so as to decrease the natural resonant frequency of the plate circuit.

The starting and operating characteristics of a usual tuned plate crystal oscillator is shown in FIGURE 2. Assume that the inductance of the plate circuit is increased from a value that is too small to sustain oscillation to a maximum value at which the oscillator suddenly stops oscillating. As the inductance of the plate circuit is increased, the amplitude of the generated signal is increased to a maximum value that either coincides with a point at which the oscillators stop oscillating or occurs only slightly before the stopping point. If the inductance of the plate circuit is adjusted at a point near maximum oscillation and the oscillator circuit is stopped by some other means than by adjusting the resonance points of the control grid or plate circuits, the oscillator will not start operating again until the inductive reactance of the plate circuit is decreased by either decreasing the inductance or the capacitance of the plate circuit. Such operation in prior circuits interferes with immediate re-use of equipment that has been adjusted for maximum response.

The starting and operating characteristic of an oscillator that uses the automatic phase correcting circuit of the present invention are shown in FIGURE 3. As the plate inductance is increased by adjustment of inductor 12, for example, beyond a minimum inductance at which oscillations start, diode 16 becomes conductive for connecting capacitor 14 through its resistance, as determined by its state of conduction, across inductor 12. In practice, a silicon diode that is non-conductive for signal levels below about one-half volt is used. As the inductance of inductor 12 is increased, the amplitude of the generated signal and the conductivity of diode 16 increase. The capacitor is coupled more closely across the inductor by the increasing conductivity of the diode, and the resonant frequency of the tuned plate circuit becomes lower for particular settings of the inductor, so that maximum output is reached with less inductance than for circuits not utilizing the diode. While the inductance of inductor 12 is being increased, the effect of the diode 16 in combination with the capacitor 14 causes a definite maximum to be reached before the oscillator stops. Then the operation of the oscillator may be interrupted while the inductance is sufficient or greater than that required for maximum amplitude and be readily started again without re-adjustment of inductor 12. Re-adjustment of the inductor 12 is not required to re-start the oscillator because when the operation of the oscillator is interrupted, diode 16 becomes non-conductive and, therefore, effectively disconnects capacitor 14 from across inductor 12. The plate circuit is, therefore, automatically tuned to a higher frequency as required for starting oscillation. The diode also operates for automatically stabilizing the amplitude of the generated signal. A change in amplitude automatically changes the resistance of diode 16 so that the oscillator operates with a slightly different inductive-to-capacitive reactance ratio for changing the amplitude of the oscillation.

A feature of the oscillator is the provision for ensuring that the oscillator will oscillate only at a single frequency rather than at some other frequency that might be determined by a different mode of oscillation of crystal 2. For eliminating oscillation at frequencies lower than a desired frequency, a choke 3 has been inserted between crystal 2 and the grid 4 of tube 1. The choke has the proper value so that the resonant frequency of the series crystal circuit is higher than the tuning frequency range of the plate circuit. At the series resonant frequency, the reactance from the control grid to ground is inductive but is less than the capacitive reactance that exists between the grid and plate at the desired frequency. Frequencies higher than the desired operating frequencies are eliminated by designing the tuning elements of the plate circuit such that they cannot be tuned to a frequency much higher than the desired frequency. At undesired higher frequencies, the plate circuit becomes capacitive so that signal voltages having proper phase for sustaining oscillation cannot exist at these frequencies.

The advantages of using an oscillator of the type described herein for communication equipment are obvious, especially for ultra-high frequency operation. In prior circuits, adjustment of the oscillator is complicated. After the oscillator in prior equipment has been adjusted for a desired maximum output, the oscillator may be inoperative after the equipment is subsequently turned on. When using an oscillator having the instant phase correction circuit, the oscillator will re-start readily after it has been adjusted for providing signal with maximum amplitude.

Although this invention has been described with respect to a particular embodiment, the phase correction circuit may be applied to other oscillator circuits in ways obvious to those skilled in the art and still be within the spirit and the scope of the following claims.

What is claimed is:

1. A crystal oscillator with a phase correction circuit, an electron tube having at least a cathode, a control grid, and a plate, a resonant circuit including a frequency-determining crystal connected between said control grid and said cathode, a tuned circuit including an inductor connected between said plate and said cathode, means for applying a positive potential to said plate and for maintaining substantially the impedance of said tuned circuit between said plate and said cathode at the frequency determined by said crystal, said phase correction circuit including a capacitor and a diode in a series circuit connected in parallel with said inductor, said diode being substantially non-conductive for oscillator signals of low amplitude and becoming increasingly conductive with increasing amplitudes above a certain level, said tuned circuit providing an inductive high-impedance circuit at the frequency of said crystals, and the capacitance being applied to said tuned circuit by said capacitor varying directly with the conductivity of said diode for ensuring that the oscillator will re-start after said tuned circuit has been adjusted for generating signal of maximum amplitude at a frequency determined by said crystal.

2. A crystal oscillator circuit as claimed in claim 1 having a choke connected between said control grid and said crystal, said choke having the required value for ensuring that said resonant circuit has inductive reactance less than the capacitive reactance that exists between said grid and said plate at the desired frequency of oscillation as determined by said crystal, but that said resonant circuit has capacitive reactance for substantially lower frequencies.

References Cited in the file of this patent

UNITED STATES PATENTS

| | | |
|---|---|---|
| 2,369,954 | Downey | Feb. 20, 1945 |
| 2,676,263 | Hugenholtz et al. | Apr. 20, 1954 |
| 2,908,868 | Jensen et al. | Oct. 13, 1959 |